United States Patent [19]

Benhamida

[11] Patent Number: 5,262,687
[45] Date of Patent: Nov. 16, 1993

[54] DECODER CIRCUIT WITH BYPASS CIRCUITRY AND REDUCED INPUT CAPACITANCE FOR GREATER SPEED

[75] Inventor: Boubekeur Benhamida, Boise, Id.

[73] Assignee: Zilog, Inc., Campbell, Calif.

[21] Appl. No.: 848,257

[22] Filed: Mar. 9, 1992

[51] Int. Cl.$^5$ .................... H03K 19/20; H03K 19/096
[52] U.S. Cl. .................... 307/452; 307/449; 307/443
[58] Field of Search ............... 307/449, 452, 443, 475, 307/481, 272.3

[56] References Cited

U.S. PATENT DOCUMENTS

| | | | |
|---|---|---|---|
| 3,989,955 | 11/1976 | Suzuki | 307/452 |
| 4,401,903 | 8/1983 | Iizuka | 307/449 |
| 4,415,819 | 11/1983 | Mathes | 307/481 |
| 4,692,639 | 9/1987 | Jordan | 307/481 |
| 4,918,663 | 4/1990 | Remington et al. | 307/272.3 |
| 4,974,241 | 11/1990 | McClure et al. | 307/279 |

Primary Examiner—Edward P. Westin
Assistant Examiner—Benjamin D. Driscoll
Attorney, Agent, or Firm—Majestic, Parsons, Siebert & Hsue

[57] ABSTRACT

An address detection circuit is described having a node A which is precharged to the voltage of a power supply and then discharged down to ground by a strobe signal if an address match occurs. An address match is detected when a nonconventional CMOS inverter which has its input connected to node A has its output go HIGH. The nonconventional CMOS inverter utilizes a device ratio between its P-mos transistor and its N-mos transistor of approximately 10 to 1 for a 1 micron CMOS process. Prior to the strobe signal discharging the node A to ground, the output of the nonconventional inverter is held to ground by a transistor which is switched OFF when the strobe signal discharging the node A to ground is initiated.

6 Claims, 3 Drawing Sheets

DECODER CIRCUIT WITH BYPASS CIRCUITRY AND REDUCED INPUT CAPACITANCE FOR GREATER SPEED

BACKGROUND OF THE INVENTION

This invention relates in general to decoder circuits and in particular, to a decoder circuit having at least one detection stage implemented with a reduced capacitive loading on a precharge/discharge node in order to speed up the decoding time.

A typical application of decoder circuits is for address decoding. In one type of address decoder circuit, $2^N$ address detection stages are required to decode n address bits. In this type of decoder circuit, each stage detects a different combination of the n address bits to which there are $2^N$ possible combinations.

FIG. 1 illustrates an example of one address detection stage 10 of such an address decoder. This stage detects when five address bits, AD1 to AD5, are all HIGH, i.e., when the address is 11111. Detection of the 31 ($2^5-1$) other combinations of the five address bits AD1–AD5 are accomplished by forming 31 other address detection stages with 31 different combinations of inverters between the address bits AD1–AD5 and their respective transistors, T1 to T5, to which they are input.

For example, detection of the address 11110 can be accomplished by a second address detection stage that differs from that shown in FIG. 1 by having an inverter inserted between the address bit AD5 and the transistor T5; and detection of the address 11100 can be accomplished by a third address detection stage having inverters inserted between the address bit AD5 and the transistor T5, and the address bit AD4 and the transistor T4. Other inverter combinations to detect other address combinations can likewise be defined.

When a given address AD1–AD5 is input to all 32 stages simultaneously, only one address detection stage out of the 32 detects an address match by each of its transistors T1–T5 being turned ON, resulting in its output being HIGH. The outputs of the other address detection stages show no match by one or more its transistors T1–T5 being turned OFF, resulting in each of their outputs being LOW.

Each address detection stage includes two phases of operation: a precharge phase and a strobing phase. Referring back to FIG. 1, the precharge phase occurs when a STROBE signal is LOW, resulting in N-mos transistor M6 being turned OFF and P-mos transistor M5 being turned ON. Since P-mos transistor M5 is ON, node B and the input to an inverter INV2 are both raised to the voltage level of the voltage source VDD, and the output of the inverter INV2 and subsequently, the OUTPUT of the address detection stage 10, are both LOW. In addition, with the output of the inverter INV2 being LOW, the P-mos transistor M4 is also turned ON, which acts to also drive node B to the voltage level of the voltage source VDD.

Also connected to node B are a series of N-mos transistors, T1 to T5, as well as, the strobe controlled transistor M6 at the end of the series. With node B HIGH, N-mos transistor T1 turns ON if address bit AD1 is HIGH and is capable of conducting current through it. Likewise, N-mos transistor T2 turns ON if address bit AD2 is HIGH and is capable of conducting current through it if transistor T1 is ON; N-mos transistor T3 turns ON if address bit AD3 is HIGH and is capable of conducting current through it if both transistors T1 and T2 are ON; N-mos transistor T4 turns ON if address bit AD4 is HIGH and is capable of conducting current through it if transistors T1, T2 and T3 are all ON; and N-mos transistor T5 turns ON if address bit AD5 is HIGH and is capable of conducting current through it if transistors T1, T2, T3 and T4 are all ON.

Since the capability of conducting current through each succeeding transistor depends upon the turning on of all preceeding transistors, this type of stacking arrangement of transistors is commonly referred to as Domino type logic. Even with all the transistors T1–T5 turned on, however, current does not flow through the stack while transistor M6 remains turned OFF. Thus node B precharges to and remains charged to the voltage level of VDD since there is no current path to ground.

After charging node B up to the voltage level VDD, the STROBE signal is changed to HIGH. This initiates the strobing phase which acts to discharge node B if all the transistors T1–T5 are turned ON. With transistors T1–T5 turned ON, as well as, N-mos transistor M6 since its input, the STROBE signal, is HIGH, a discharge path from node B to ground VSS is available.

With node B being discharged to ground level, the input to inverter INV2 goes LOW and its output, as well as, the OUTPUT of the address detection stage 10, then goes HIGH. The HIGH state of the output of the address detection stage 10 then indicates that an address match has been found. Finally, with the output of the inverter INV2 being HIGH, P-mos transistor M4 turns OFF. With both P-mos transistors M4 and M5 turned OFF, node B no longer has access to the voltage source VDD, and consequently, discharges like a capacitor through the transistor stack.

OBJECTS AND SUMMARY OF THE INVENTION

An ongoing goal of circuit design is to reduce circuit execution time. This goal is especially important in certain applications such as those requiring memory access times to be as fast as possible.

Accordingly, one object of the present invention is to reduce the required address decoding time in a memory accessing circuit.

Another object is to reduce the decoding time of a Domino type decoder circuit similar to the type described in FIG. 1.

These and additional objects are accomplished by the various aspects of the present invention. One aspect of the present invention is the observation that the address detection time and consequently, the decoding time can be reduced by reducing the input capacitance experienced at node B of FIG. 1.

Another aspect of the invention accomplishes one or more of these objects by the observation that a reduction in the input capacitance experienced at node B of FIG. 1 can be achieved by reducing the capacitance of the inverter INV2.

Another aspect of the invention accomplishes one or more of these objects by the observation that a reduction in the capacitance of the inverter INV2 can be achieved without affecting the ability of the inverter to drive its output HIGH when its input is LOW, by reducing the device dimensions of a N-mos transistor in the inverter to the smallest dimensions possible restricted only by the transistor processing technology.

Another aspect of the invention accomplishes one or more of these objects by the observation that by reducing the device dimensions of the N-mos transistor in the inverter to the smallest dimensions possible restricted only by the transistor processing technology and as a consequence, increasing the device ratio between a P-mos transistor in the inverter as compared to that of the N-mos transistor in the inverter beyond that generally experienced in conventional inverters, not only is the capacitance of the inverter reduced, but also the switching point of the inverter is raised and consequently, the inverter output switches to its HIGH state faster than a conventional inverter.

Another aspect of the invention accomplishes one or more of these objects by replacing the conventional inverter INV2 (FIG. 1) which typically has a 2 or 3 to 1 device ratio between its P-mos transistor and its N-mos transistor in order to balance the switching times between its output being driven HIGH and its output being driven LOW which are different due to the mobility of electrons being higher than that for holes, by a nonconventional CMOS inverter INV1 (FIG. 2) which has a device ratio of at least 4 to 1 and preferably around 10 to 1 between its P-mos transistor and its N-mos transistor in order to maintain or enhance its switching time for its output to be driven HIGH.

Another aspect of the invention accomplishes one or more of these objects by providing a voltage holding means which holds the output of a decoder stage to ground until a STROBE signal goes HIGH and initiates the strobing phase of an address detector circuit.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 2:
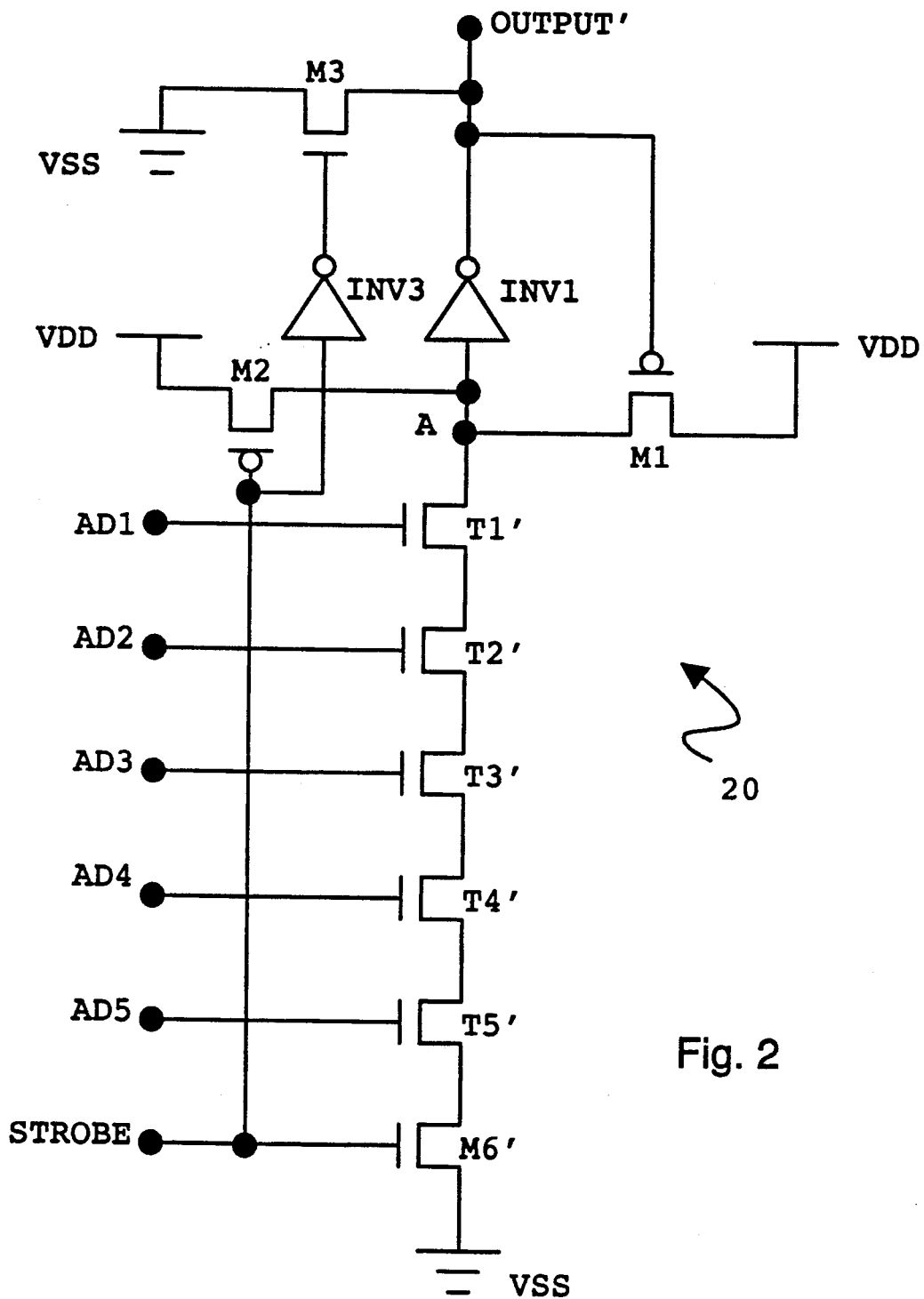
FIG. 2 illustrates one address detection stage of a decoder circuit utilizing aspects of the present invention.

FIG. 2 illustrates as an example, an address detection stage 20 of an address decoder utilizing aspects of the present invention. When the STROBE signal is LOW, N-mos transistor M6' is OFF, P-mos transistor M2 is ON, and N-mos transistor M3 is ON. Since N-mos transistor M3 is ON, OUTPUT' is being held to VSS and P-mos transistor M1 is ON. Thus, node A is precharged to VDD since it has no path to ground, while OUTPUT' is being held to VSS.

During this precharge phase, each of the N-mos transistors T1' to T5' are being switched ON or OFF depending upon the values of their respective input address bits AD1 to AD5. Assuming that all of the address bits AD1 to AD5 are HIGH, then each of the transistors T1' to T5' are turned ON in FIG. 2, and current is being prevented from flowing through the stack of transistors T1' to T5' only because transistor M6' is OFF.

When the STROBE signal switches to HIGH, N-mos transistor M6' switches ON, P-mos transistor M2 switches OFF, and N-mos transistor M3 switches OFF. Since the P-mos transistor M1 is designed to be too weak to hold node A at VDD, the charge built up at that node is discharged through the stack of transistors T1' to T5' and transistor M6' which form a path to ground VSS.

As node A discharges, the output of inverter INV1 switches to HIGH and consequently, OUTPUT' goes HIGH indicating that an address match has occurred at address detection stage 20. In addition, when the output of inverter INV1 switches to HIGH, P-mos transistor M1 switches OFF and consequently, node A no longer has a direct path to the voltage supply VDD and discharging of the node accelerates.

By reducing the time for the inverter INV1 to switch from HIGH to LOW or LOW to HIGH, the time required for performing the address detection function in circuit 20 can be correspondingly reduced. A major factor in determining the time required for inverter INV1 to switch from HIGH to LOW or LOW to HIGH is the capacitance of inverter INV1. The capacitance of inverter INV1 is also a major factor in determining the input capacitance to node A and consequently, how fast node A can discharge through the transistor stack T1' to T5'. By reducing the capacitance of inverter INV1, both the switching time of the inverter's input and the switching time of the inverter itself can be reduced. Accordingly, this capacitance is minimized by forming a nonconventional inverter INV1.

Figure 3:
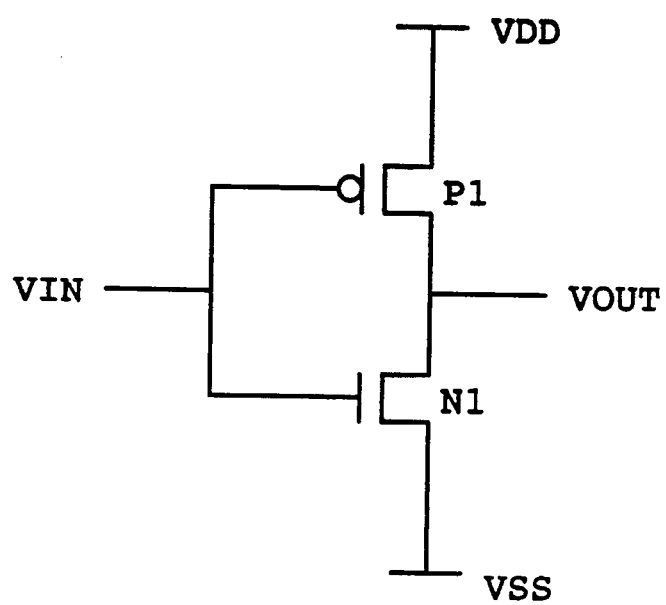
FIG. 3 illustrates a conventional CMOS inverter circuit.

FIG. 3 illustrates a typical CMOS inverter. When the input voltage VIN is HIGH, P-mos transistor P1 is turned OFF and N-mos transistor N1 is turned ON. As a consequence, the output voltage VOUT is pushed down to ground VSS. On the other hand, when the input voltage VIN is LOW, P-mos transistor P1 is turned ON and N-mos transistor N1 is turned OFF. As a consequence in this case, the output voltage VOUT is pulled up to the supply voltage VDD.

Figure 1:
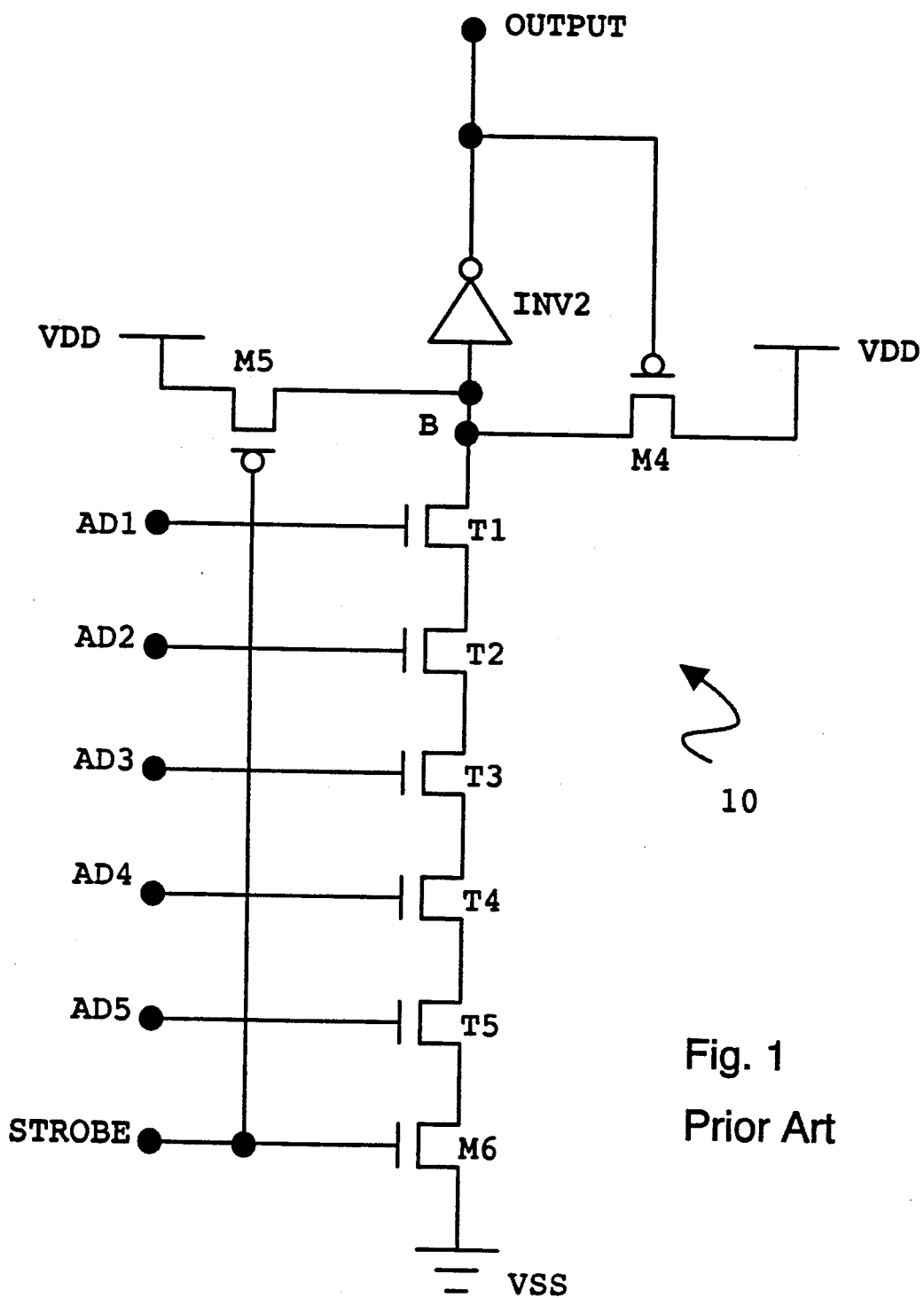
FIG. 1 illustrates, as an example, one address detection stage of a prior art decoder circuit.

In a conventional inverter such as inverter INV2 (FIG. 1), it is desirable that the switching time for VOUT be approximately the same whether VOUT is being pulled up to the supply voltage VDD or being pushed down to ground VSS. Since the switching times of P-channel devices and N-channel devices are inherently different, this requires that the device ratio between the P-mos transistor P1 and the N-mos transistor N1 be approximately 2 or 3 to 1, where the device ratio is defined as:

$$\text{Device Ratio} = (Wp/Lp) \div (Wn/Ln) \qquad (1)$$

Where:

Wp = Channel width of the P-mos transistor;
Lp = Channel length of the P-mos transistor;
Wn = Channel width of the N-mos transistor; and
Ln = Channel length of the N-mos transistor.

Referring back to FIG. 2, the capacitance of the CMOS inverter INV1 includes capacitative contributions from both its P-mos and N-mos transistors that make up the inverter. By reducing the physical dimensions of these devices, their respective capacitative contributions to the capacitance of inverter INV1 can be reduced.

It is desirable, however, not to reduce the size of the P-mos transistor of inverter INV1, because it is undesirable to reduce its current carrying capability which would diminish as the dimensions of the device diminishes. Since the inverter INV1 drives the OUTPUT', the detection of an address match occurs when OUTPUT' goes HIGH, and OUTPUT' goes HIGH when the P-mos transistor of inverter INV1 turns ON, sufficient current carrying capability through the P-mos transistor is desirable in order that the output of the inverter INV1 is pulled up to VDD as quickly as possible.

On the other hand, the current carrying capability of the N-mos transistor of inverter INV1 is not a concern. As shown in FIG. 2, the transistor M3 acts as a parallel connection to the N-mos transistor of inverter INV1 in pushing the output of the inverter INV1 to ground VSS when the input to the inverter INV1 is HIGH. Therefore, the output of the inverter INV1 can be pushed down to VSS as quickly as possible by properly sizing the transistor M3, irrespective of the dimensions of the N-mos transistor of inverter INV1. Therefore, the dimensions of the N-mos transistor of CMOS inverter INV1 can be minimized to reduce the capacitance contribution of this transistor to the overall capacitance of the inverter INV1 without significantly deteriorating the detection performance of an address match.

Consequently, due to the special nature of the address detection circuit 20, a nonconventional inverter INV1 can be defined which adequately performs its inverter function with respect to the special needs of the detection circuitry while at the same time, reduces its capacitance as compared to a conventional inverter such as INV2 (FIG. 1) by minimizing the physical dimensions of its N-channel device.

As an example, in a 1 micron CMOS technology, a typical channel width for the P-mos transistor of the conventional inverter might be 25 microns and a typical channel width for the N-mos transistor of the conventional inverter might be 10 microns while the typical channel lengths of both the P-mos and N-mos transistors is 1 micron. By reducing the channel width of the N-mos transistor to that limited only by the manufacturing technology, for example perhaps, 3 microns, the capacitive contribution of the N-mos transistor can be significantly decreased. In addition, the device ratio between the P-mos transistor and the N-mos transistor is increased from a ratio of 2.5 to 1, to a ratio of 8.67 to 1.

A second benefit also results when the device ratio between the P-mos transistor and the N-mos transistor increases. The higher ratio results in a higher switching voltage. For example, whereas the input voltage to the inverter VIN may have had to drop to 50% of VDD before the output voltage VOUT switched HIGH, with the higher switching voltage the input voltage VIN may now only need to drop to 75% of VDD before the output voltage VOUT switches to HIGH. This effectively increases the switching speed of the inverter when the inverter is being switched to a HIGH output. Since a HIGH output from the inverter causes OUTPUT' to be HIGH and consequently, an address match to be detected, this effectively also helps to reduce the detection time of an address match.

Although the various aspects of the present invention have been described with respect to a preferred embodiment, it will be understood that the invention is entitled to full protection within the full scope of the appended claims.

What is claimed is:

1. A decoder circuit having at least one output and a plurality of inputs, said inputs including a plurality of decodable bits and a strobe signal, said circuit further having a node, means for precharging said node to a first predetermined voltage level when said strobe signal is a first voltage level, and means for discharging said node to a second predetermined voltage level when said decodable bits are of a preselected combination and said strobe signal is a second voltage level, the improvement comprising:

a first inverter having an input connected to said node and an output which generates at least one of said outputs of the decoder circuit; and bypass means, connected to said output of said first inverter and responsive to said strobe signal, for pushing said output to ground when said strobe signal is said first voltage level.

2. The decoder circuit as recited in claim 1, wherein said first inverter comprises:

a first transistor of one conductivity having a source, a drain and a gate; and a second transistor of a different conductivity than said first transistor, said second transistor having a source, a drain and a gate, said source of said first transistor being connected to a supply voltage equal to said first predetermined voltage level, said drain of said first transistor being connected to said source of said second transistor and said output of said inverter being generated at said connection point, said drain of said second transistor being connected to a ground voltage equal to said second predetermined voltage level, and said gate of said first transistor and said gate of said second transistor both being connected to said input of said inverter.

3. The decoder circuit as recited in claim 2, wherein said first transistor is a P-mos transistor and said second transistor is a N-mos transistor.

4. The decoder circuit as recited in claim 3, wherein the physical dimensions of said second transistor is minimized to approximately the smallest dimensions allowed by its transistor processing technology, and the device ratio between the first transistor and the second transistor is at least 4 to 1.

5. The decoder circuit as recited in claim 1, wherein said bypass means comprises:

a second inverter having an input and an output; and a transistor having a source, a drain and a gate, said input of said second inverter being connected to said strobe signal, said output of said second inverter being connected to said gate of said transistor, said source of said transistor being connected to said output of said first inverter, and said drain of said transistor being connected to a ground voltage equal to said second predetermined voltage level.

6. The decoder circuit as recited in claim 5, wherein the transistor of said bypass means is a N-mos transistor.

* * * * *